(12) United States Patent
Hiraiwa et al.

(10) Patent No.: US 8,387,559 B2
(45) Date of Patent: Mar. 5, 2013

(54) SEMICONDUCTOR MANUFACTURING PLANT

(75) Inventors: Jiro Hiraiwa, Osaka (JP); Osamu Yoshimoto, Osaka (JP); Hiroshi Hayakawa, Osaka (JP); Tetsuro Tojo, Osaka (JP); Tsuneyuki Okabe, Nirasaki (JP); Takanobu Asano, Oshu (JP); Shinichi Wada, Nirasaki (JP); Ken Nakao, Nirasaki (JP); Hitoshi Kato, Nirasaki (JP)

(73) Assignees: Toyo Tanso Co., Ltd., Osaka-shi (JP); Tokyo Electron Limited, Tokyo (JP)

( * ) Notice: Subject to any disclaimer, the term of this patent is extended or adjusted under 35 U.S.C. 154(b) by 862 days.

(21) Appl. No.: 12/278,407

(22) PCT Filed: Feb. 7, 2007

(86) PCT No.: PCT/JP2007/052087
§ 371 (c)(1),
(2), (4) Date: Aug. 5, 2009

(87) PCT Pub. No.: WO2007/091583
PCT Pub. Date: Aug. 16, 2007

(65) Prior Publication Data
US 2010/0064969 A1    Mar. 18, 2010

(30) Foreign Application Priority Data
Feb. 7, 2006 (JP) .................. 2006-029299

(51) Int. Cl.
*C23C 16/455* (2006.01)
*C23C 16/52* (2006.01)
*C23F 1/00* (2006.01)
*H01L 21/306* (2006.01)
*C23C 16/06* (2006.01)
*C23C 16/22* (2006.01)

(52) U.S. Cl. ........ 118/695; 118/663; 118/696; 118/698; 118/704; 118/715; 156/345.24; 156/345.29

(58) Field of Classification Search .................. 118/663, 118/695, 698, 704, 715; 156/345.24, 345.29
See application file for complete search history.

(56) References Cited

U.S. PATENT DOCUMENTS
6,602,433 B1  8/2003  Bhardwaj et al.
2003/0047445 A1  3/2003  Tojo et al.
(Continued)

FOREIGN PATENT DOCUMENTS
JP    62-72117    4/1987
JP    62 72117    4/1987
(Continued)

OTHER PUBLICATIONS

Extended European Search Report issued Mar. 19, 2012, in Patent Application No. 07708131.3.

(Continued)

*Primary Examiner* — Rudy Zervigon
(74) *Attorney, Agent, or Firm* — Oblon, Spivak, McClelland, Maier & Neustadt, L.L.P.

(57) ABSTRACT

Fluorine gas generators are connected with semiconductor manufacturing apparatuses through a gas supplying system including a storage tank that can store a predetermined quantity of fluorine gas generated in the on-site fluorine gas generators. When one or more of the on-site fluorine gas generators are stopped, fluorine gas is supplied to the semiconductor manufacturing apparatuses from the storage tank storing a predetermined quantity of fluorine gas, so as to keep the operations of the semiconductor manufacturing apparatuses. Thereby obtained is a semiconductor manufacturing plant in which fluorine gas generated in the fluorine gas generators can be safely and stably supplied to the semiconductor manufacturing apparatuses, and with superior cost performance.

13 Claims, 5 Drawing Sheets

U.S. PATENT DOCUMENTS

| | | | |
|---|---|---|---|
| 2003/0121796 A1 | 7/2003 | Siegele et al. | |
| 2004/0055874 A1 | 3/2004 | Hiraiwa et al. | |
| 2004/0108201 A1 | 6/2004 | Tojo et al. | |
| 2004/0123907 A1 | 7/2004 | Kim et al. | |
| 2004/0151656 A1 | 8/2004 | Siegele et al. | |
| 2005/0161321 A1 | 7/2005 | Kennedy et al. | |
| 2005/0177273 A1 | 8/2005 | Miyazaki et al. | |
| 2005/0247341 A1* | 11/2005 | Tojo et al. ..................... | 137/206 |

FOREIGN PATENT DOCUMENTS

| | | |
|---|---|---|
| JP | 4 352326 | 12/1992 |
| JP | 4-352326 | 12/1992 |
| JP | 9-306825 | 11/1997 |
| JP | 2002 339090 | 11/2002 |
| JP | 2003-193278 | 7/2003 |
| JP | 2003 257870 | 9/2003 |
| JP | 2003-257870 | 9/2003 |
| JP | 2004 107761 | 4/2004 |
| JP | 2004107761 A * | 4/2004 |
| JP | 2004 169123 | 6/2004 |
| JP | 2005 52724 | 3/2005 |
| JP | 2005-52724 | 3/2005 |
| JP | 2007211261 A * | 8/2007 |
| JP | 2009024222 A * | 2/2009 |
| JP | 2009213946 A * | 9/2009 |
| JP | 2009213947 A * | 9/2009 |
| JP | 2009215588 A * | 9/2009 |
| WO | WO 03/046244 | 6/2003 |

OTHER PUBLICATIONS

Office Action issued Mar. 29, 2012, in Korean Patent Application No. 10-2008-7021573 (with English-language translation).

Office Action issued Jul. 8, 2011, in Korean Patent Application No. 2008-7021573 with English translation.

Office Action mailed Oct. 29, 2012, in Korean Patent Application No. 2008-7021573, (w/English translation), pp. 7.

* cited by examiner

SEMICONDUCTOR MANUFACTURING PLANT

TECHNICAL FIELD

The present invention relates to a semiconductor manufacturing plant in which fluorine gas generated in a fluorine gas generator is stably supplied to a semiconductor manufacturing apparatus.

BACKGROUND ART

Fluoride gases (such as $NF_3$, $CF_4$, and $C_2F_6$) other than fluorine gas have hitherto widely used in great quantities for semiconductor manufacturing processes because of their high performances. However, because such fluoride gases have high global warming potentials to harm the global environment, it has been decided that the use of them is prohibited or restricted hereafter.

The global warming potential of fluorine gas is zero. Thus, it starts to consider the use of fluorine gas in place of the above-described fluoride gases. However, because fluorine gas is high in corrosiveness and reactivity, it entails risks to transport or store a large amount of fluorine gas with the use of a cylinder. Currently, for those reasons, fluorine gas starts to be used with a cylinder in which fluorine gas has been diluted by 20% or less with inert gas. However, this leads to low efficiency of transportation. In addition, there are also unsolved problems in safeness.

For the above reasons, the industrial world has requested an on-site fluorine gas generator or the like for using fluorine gas on the spot where the gas was safely and stably generated. About it, some proposals have been made. However, although an interface system (fluorine gas supplying system) becomes very important for ensuring consistency of the fluorine gas use quantity and stable supply between the on-site fluorine gas generator and an apparatus that uses fluorine gas, the study of it is scarcely done at present. It has been found that the fluorine gas stable supply and the cost performance of it become a subject of discussion when fluorine gas generated from the on-site fluorine gas generator is supplied to a semiconductor manufacturing apparatus via a fluorine gas supplying system.

In the case of ordinary gas, the above request can be met by a manner that a number of cylinders filled with gas are connected in parallel; a cylinder used is switched to the next cylinder; and the used cylinder is replaced with a new cylinder. Also in the case of fluorine gas, the use of it has been started by a manner that each cylinder is filled with fluorine gas at a low concentration of 20% in consideration of safety; and the cylinders are set in a cylinder cabinet like the case of the above-described ordinary gas. However, because fluorine gas has been diluted by 20%, a large volume is required accordingly and the efficiency of transportation is low. Even in the case of fluorine gas at a low concentration, if a gate valve provided on a cylinder head is broken due to corrosion or the like, there is possibility that the full amount of gas contained in the cylinder leaks out. For these reasons, a supplying method has been desired by which fluorine gas can be supplied safely and stably, and the physical unit of product of fluorine gas is advantageous in comparison with conventional methods. We have hitherto proposed on-site fluorine gas generators that can be used on semiconductor manufacturing spots (generators that can stably supply fluorine gas by controlling the pressure in the generators) (for example, see the below Patent Documents 1 to 3 and so on).

Patent Document 1: Japanese Patent Unexamined Publication No. 2004-107761
Patent Document 2: Japanese Patent Unexamined Publication No. 2004-169123
Patent Document 3: U.S. Pat. No. 6,602,433

Problem that the Invention is to Resolve

When a fluorine gas generator is equipped, the supply capacity of the fluorine gas generator is basically determined by the design specification of gas supply capacity to the demand. However, when the demand exceeds the supply capacity of one fluorine gas generator, this is coped with by preparing a number of fluorine gas generators having the same specification.

However, an on-site fluorine gas generator requires maintenance at certain intervals, such as every three months, every half year, or everyone year. The maintenance requires the time of about one to three days. There is a problem that the generator can not supply gas during the maintenance.

Further, when one or more on-site fluorine gas generators are used, a system is required in which exchange of gas with a semiconductor manufacturing apparatus that uses the gas is smoothly controlled so that the manufacture of semiconductors can be continued without stopping gas supply during the operation of the semiconductor manufacturing apparatus even when a trouble or the need for maintenance arises on a fluorine gas generator.

The present invention was made in consideration of the above-described problem. An object of the present invention is to provide a semiconductor manufacturing plant in which fluorine gas generated in a fluorine gas generator can be safely and stably supplied to a semiconductor manufacturing apparatus, and the semiconductor manufacturing cost performance is superior.

Means for Resolving the Problem and Effects

In a semiconductor manufacturing plant of the present invention, at least one fluorine gas generator is connected with at least one semiconductor manufacturing apparatus through a gas supplying system including a storage tank that can store therein a predetermined quantity of fluorine gas generated in the fluorine gas generator, and fluorine gas is supplied from the storage tank, which stores therein a predetermined quantity of fluorine gas, to the semiconductor manufacturing apparatus so as to keep the operation of the semiconductor manufacturing apparatus when the fluorine gas generator is stopped.

In the above construction, even when the fluorine gas generator is stopped for maintenance or due to an abnormality, a predetermined quantity of fluorine gas (for example, corresponding to the time required for the maintenance or recovery of the emergency stop) has been stored in the storage tank. Therefore, the semiconductor manufacturing apparatus can be operated without stopping with minimizing the variation in pressure load. Further, because the semiconductor manufacturing apparatus need not be stopped during maintenance of the fluorine gas generator or the like, the semiconductor manufacturing apparatus can be continuously operated. Thus, the operation rate of the apparatus for semiconductor manufacture is not lowered and the cost performance becomes superior.

In the semiconductor manufacturing plant of the present invention, it is preferable that the gas supplying system comprises a pressure monitoring unit that detects the pressure in the storage tank to detect the storage quantity of the storage tank by the value of the detected pressure; a pressure value converting unit that converts the pressure value into a signal; and a signal transmitting unit that outputs toward the semiconductor manufacturing apparatus the signal converted by the signal converting unit, and the semiconductor manufacturing apparatus comprises a signal receiving unit that receives the signal from the signal transmitting unit; a signal converting unit that converts into a pressure value the signal received by the signal receiving unit; and a displaying unit that displays the pressure value derived by the signal converting unit.

When gas is stored within a limited capacity as in this system, it is very important for compatibility of usability and cost performance that an accurate gas storage quantity can be displayed on the semiconductor manufacturing apparatus as described above. If such information can not be provided, it is thinkable that gas supply becomes deficient in the course of the semiconductor manufacturing process in the worst case. In that case, all products subjected to the process may become defectives. This matter must be essentially avoided for improving the cost performance of the apparatus. In the above construction, therefore, because the storage quantity of fluorine gas in the storage tank can accurately be detected, displaying the information on the semiconductor manufacturing apparatus makes it possible to smoothly perform the semiconductor manufacturing process.

In the semiconductor manufacturing plant of the present invention, it is preferable that the gas supplying system comprises an inlet-side gate valve and an outlet-side gate valve respectively provided upstream and downstream of the storage tank; a bypass interconnecting the fluorine gas generator and the semiconductor manufacturing apparatus with bypassing the storage tank; a bypass gate valve provided in the middle of the bypass; and a gate valve controlling unit that controls the respective gate valves, and the gate valve controlling unit performs control to close the bypass gate valve and open the inlet- and outlet-side gate valves so as to supply gas via the storage tank to the semiconductor manufacturing apparatus that requires gas, when the gas supplying system is in a normal operation; and performs control to switch the gas supplying system into a maintenance mode, close the inlet- and outlet-side gate valves, and open the bypass gate valve so as to supply gas from the fluorine gas generator that can supply gas, to the semiconductor manufacturing apparatus that requires gas, with bypassing the storage tank when the gas supplying system is stopped due to maintenance or a breakdown.

In the above construction, when the gas supplying system normally operates, fluorine gas is supplied via the gas supplying system to the semiconductor manufacturing apparatus that requires gas. When the gas supplying system requires some kind of maintenance, the system can be changed into a maintenance mode, in which fluorine gas is supplied from the fluorine gas generator that can supply gas, to the semiconductor manufacturing apparatus that requires gas, by bypassing the gas supplying system. Because this control is possible, the gas supply path can quickly be changed when gas supply from the storage tank in the gas supplying system is stopped. Therefore, the semiconductor manufacturing apparatus can be continuously operated without interrupting the semiconductor manufacturing process in the semiconductor manufacturing apparatus.

In the semiconductor manufacturing plant of the present invention, it is preferable that a fluorine gas generator gate valve is provided between each fluorine gas generator and the gas supplying system, fluorine gas generator pressure detecting units are respectively provided upstream and downstream of each fluorine gas generator gate valve, and the plant further comprises a gas supply availability deciding unit that monitors the difference in pressure value between each fluorine gas generator and the gas supplying system detected by the respective fluorine gas generator pressure detecting unit so as to decide availability of fluorine gas supply from each fluorine gas generator to the storage tank.

In the above construction, when the fluorine gas generator contains therein a sufficient amount of fluorine gas that can be supplied, the supply availability deciding unit can decide that gas can be supplied. In this case, gas can be supplied toward the storage tank. Contrastingly, in the case that the fluorine gas generator does not contain therein a sufficient amount of fluorine gas to be supplied, even when the fluorine gas generator is operating to generate gas, actually the gas can not be supplied to the subsequent gas supply system. In the case of not having the above construction, if the fluorine gas generator is connected with the gas supplying system without discretion, the gas supplying system exceeds the on-site fluorine gas generator in gas supply capacity. As a result, gas counterflows from the gas supplying system to the fluorine gas generator. This phenomenon may inhibit gas supply from the gas supplying system to the semiconductor manufacturing apparatus. This is a problem that affects semiconductor manufacturing processes. Therefore, by adopting the above construction, when the fluorine gas generator do not contain therein a sufficient amount of fluorine gas, connection with the gas supplying system can be forbidden. This can prevent the above-described problem.

In the fluorine gas generator, it is preferable that the fluorine gas generator comprises a fluorine gas generator judging unit that sends out an abnormality signal on the basis of a signal from a sensor provided in the fluorine gas generator when the sensor detects an internal abnormality, the gas supplying system comprises a fluorine gas generator abnormality signal receiving unit that receives the abnormality signal sent out from the fluorine gas generator judging unit, and the fluorine gas generator abnormality signal receiving unit sends a signal to the fluorine gas generator gate valve to be closed between the gas supplying system and each fluorine gas generator when the fluorine gas generator abnormality signal receiving unit receives an abnormality signal sent from the fluorine gas generator judging unit.

In the above construction, for example, when the fluorine gas generator has some abnormality (for example, detection of an abnormality by a sensor such as a pressure, temperature, or gas detector), the judging unit sends out an abnormality signal. The gas supplying system having received the signal can automatically close the gate valve between the gas supplying system and the fluorine gas generator that output the abnormality signal. Thereby, the gas generator that can not continue to operate is disconnected from the gas supplying system, and it can be safely put in a maintenance state.

In the semiconductor manufacturing plant of the present invention, it is preferable that a semiconductor manufacturing apparatus gate valve is provided between each semiconductor manufacturing apparatus and the gas supplying system, the semiconductor manufacturing apparatus comprises a semiconductor manufacturing apparatus judging unit that generates an abnormality signal on the basis of a signal from a sensor provided in the semiconductor manufacturing apparatus when the sensor detects an internal abnormality, the gas supplying system comprises a semiconductor manufacturing apparatus abnormality signal receiving unit that receives the abnormality signal sent out from the semiconductor manufacturing apparatus judging unit, and the semiconductor manufacturing apparatus abnormality signal receiving unit sends a signal to the semiconductor manufacturing apparatus gate valve to be closed when the semiconductor manufacturing apparatus abnormality signal receiving unit receives an abnormality signal sent out from the semiconductor manufacturing apparatus judging unit.

In the above construction, when a semiconductor manufacturing apparatus has an abnormality, the gate valve between the semiconductor manufacturing apparatus and the gas supplying system is automatically closed. This can prevent an erroneous operation of another apparatus and second accidents.

In the semiconductor manufacturing plant of the present invention, it is preferable that the gas supplying system further comprises: (1) a first path having a first storage tank gate valve in the middle of the path, through which fluorine gas can be supplied by its own pressure in the storage tank to the semiconductor manufacturing apparatus; (2) a second path having, in the middle of the path, a pressure controlling unit that controls the gas outlet pressure from the storage tank, and a second storage tank gate valve provided between the pressure controlling unit and the storage tank; (3) a path pressure detecting unit provided in a path between the storage tank and the semiconductor manufacturing apparatus or in the second path so as to be able to detect the pressure in the first or second path; (4) a path controlling unit that controls switching into the first and second paths in accordance with the pressure value detected by the path pressure detecting unit; and (4) an operation controlling unit that controls the operation of the pressure controlling unit when the path is switched by the path controlling unit into the second path.

In the above construction, first, by using the first path, gas stored in the storage tank can be supplied by its own pressure to the lower limit of supply. In the semiconductor manufacturing apparatus as the destination of supply, gas is used normally by using a flow rate controller such as a mass flow controller. Thus, the mass flow controller serves as a resistance in supply, and the supply lower limit pressure on the primary side is, for example, about 50 kPa. At this time, the path is switched into the second path and the pressurizer is operated to supply gas. Thereby, from that state, gas in the storage tank can be further supplied to the semiconductor manufacturing apparatus. Specifically, as the pressurizer, a dry type pump such as a bellows pump or a diaphragm pump can suitably be used. In those pressurizers, the ability of pressurizing gas is, for example, around 200 kPa. However, it is a sufficient pressure for operating the mass flow controller as described above. By using such a pressurizer, gas in the storage tank can be further sucked to be sent to the subsequent stage. Thus, gas in the storage tank can efficiently be used. When switching the gas supply path and controlling the operation of the pressurizer are in the form of automatic control by combination of the sequencer 200 and pressure monitoring, they can conveniently be used. By these artifices, fluorine gas can stably be supplied to the semiconductor manufacturing apparatus with minimizing the variation in pressure load.

In the gas supplying system, it is preferable that each of the fluorine gas generator, the gas supplying system, and the semiconductor manufacturing apparatus is contained in a casing equipped with an exhaust mechanism, and each exhaust mechanism comprises a fluorine gas or hydrogen fluoride gas detector that detects fluorine gas or hydrogen fluoride gas.

In the above construction, because each system component is surrounded by a casing and each casing is equipped with an exhaust mechanism that detects fluorine gas or hydrogen fluoride gas, leak of fluorine gas or hydrogen fluoride gas can be detected in the semiconductor manufacturing plant. For example, when an exhaust mechanism detects a gas, it may be decided that leak of gas occurs, and a sequencer 200 may send out an abnormality signal. Leak of gas is a matter of concernment. Thus, when the event occurs, for example, the operation of the target system component may be stopped in accordance with a control instruction from the sequencer 200 to inspect. If necessary, maintenance/repair can be performed.

BEST FORM FOR CARRYING OUT THE INVENTION

Hereinafter, a semiconductor manufacturing plant according to an embodiment of the present invention will be described. FIG. 1 is a schematic diagram of a principal part of a semiconductor manufacturing plant according to the embodiment of the present invention.

In FIG. 1, each of reference numerals 1a, 1b, 1c, 1d, and 1e (1a to 1e: hereinafter, similar expressions will be used) denotes an on-site fluorine gas generator; 2 denotes a gas supplying system; each of 3a to 3e denotes a semiconductor manufacturing apparatus; each of 4a to 4e, 5a to 5e, and 6 denotes a pressure gauge; each of 7a to 7e and 8a to 8e denotes a gate valve; 9 denotes a bypass gate valve; 10 denotes an inlet-side gate valve; each of 11a and 11b denotes an outlet-side gate valve; 12 denotes a storage tank; 13 denotes a pressurizer; each of 15a to 15e denotes an abnormality occurrence gate valve; and 16 denotes a bypass. Reference numeral 100 including all of them denotes a semiconductor manufacturing plant. The semiconductor manufacturing plant 100 further includes a sequencer 200 for controlling each part, which is connected with the use of an electrical unit, a radio-wave unit, a mechanical unit, or the like, so as to be able to make transmission and reception with each part or each apparatus.

Each of the on-site fluorine gas generators 1a to 1e can generate fluorine gas on the spot where the gas is used. Each generator generates therein gas in advance, and stores therein a certain amount of fluorine gas till it becomes possible to be supplied.

As shown in FIG. 1, the on-site fluorine gas generator 1a includes an on-site fluorine gas generator main body 24a and an abnormality detection sensor 23a in a casing 22a equipped with an exhaust mechanism 21a. The on-site fluorine gas generator 1a further includes a judging device 25a and a signal transmitting/receiving device 26a outside the casing 22a. In a modification, the design of the casing 22a may be changed so as to include therein the judging device 25a and the signal transmitting/receiving device 26a. The exhaust mechanism 21a includes a detector $21a_1$ that can detect leak of fluorine gas or hydrogen fluoride gas. The abnormality detection sensor 23a can detect an abnormality of the fluorine gas generator main body 24a or an abnormality of another part in the casing 22a (for example, a not-shown pressurizer) or the like. Results in the detector $21a_1$ and the abnormality detection sensor 23a are sent as signals to the abnormality judging device 25a, which judges whether or not an abnormality such as leak of gas or breakdown occurs. When an abnormality has occurred, the signal transmitting/receiving device 26a sends out a signal to a predetermined device, gate valve, or the like. The signal transmitting/receiving device 26a can also receive an external signal. The respective on-site fluorine gas generators 1b to 1e include on-site fluorine gas generator main bodies 24b to 24e and abnormality detection sensors 23b to 23e in respective casings 22b to 22e equipped with exhaust mechanisms 21b to 21e having the same construction; and judging devices 25b to 25e and signal transmitting/receiving devices 26b to 26e outside the respective casings 22b to 22e. Thus, the description thereof is omitted.

The gas supplying system 2 includes gate valves 8a to 8e provided on the connection side to the fluorine gas generators; a bypass gate valve 9 provided in the middle of a bypass 16; a storage tank 12; an inlet-side gate valve 10 provided on the inlet side of the storage tank 12; outlet-side gate valves 11a and 11b provided on the outlet side of the storage tank 12; a pressurizer 13 provided downstream of the outlet-side gate valve 11b; and a pressure gauge 6 for measuring the pressure in the pipe in the gas supplying system 2 and the pressure in the storage tank 6. The storage tank 12 may have an exclusive pressure gauge 14 for checking its internal pressure. The gas supplying system 2 further includes a not-shown casing, which is equipped with an exhaust mechanism having a detector that can detect leak of fluorine gas or hydrogen fluoride gas. The gas supplying system 2 further includes a signal transmitting/receiving device 17 that receives a signal from each apparatus and transmits the received signal to each valve, apparatus, or the like; and an arithmetic processor 18 that converts a pressure value signal sent from the pressure gauge 6 or 14 into a storage quantity signal.

The lower limit pressure for using fluorine gas stored in the storage tank 12 is determined by the supplying method to the semiconductor manufacturing apparatuses 3a to 3e. When the interior of each semiconductor manufacturing apparatus is at a reduced pressure and the control of fluorine gas to be introduced is made by the internal pressure of each of the semiconductor manufacturing apparatuses 3a to 3e, that pressure value (control is normally made under a reduced pressure: not more than the atmospheric pressure) becomes the lower limit value of the pressure that enables supply from the storage tank 12 to the semiconductor manufacturing apparatuses 3a to 3e, and thus the pressurizer 13 is not particularly required. However, when the flow rate of fluorine gas must be precisely regulated in the case of introducing from the storage tank 12 to the semiconductor manufacturing apparatuses 3a to 3e by connecting a mass flow controller or the like, a pressure loss of about 30 kPa to 100 kPa is generated in the mass flow controller, and thus the pressure loss of the used mass flow controller becomes the lower limit pressure for supply of fluorine gas from the gas supplying system 2 to the semiconductor manufacturing apparatuses 3a to 3e.

When the pressurizer 13 is used, though depending on the kind and the performance, fluorine gas in the storage tank 12 can be discharged to the degree of about 70 kPa to 20 kPa. In addition, fluorine gas having passed through the pressurizer 13 can be increased in its pressure to the upper limit of the capacity of the pressurizer 13. That is, by combining the storage tank 12 and the pressurizer 13, the gas stored in the storage tank 12 can be used more efficiently than the case in which the gas stored in the storage tank 12 is supplied toward the mass flow controller by the pressure of the gas itself. Thus, fluorine gas can be supplied to the semiconductor manufacturing apparatuses 3a to 3e at a pressure necessary for using the gas. Thereby, the quantity of gas remaining in the storage tank 12 can be more reduced. Therefore, when the pressurizer 13 is provided, the storage tank 12 can be reduced in size.

As for the pressurizer 13 used here, a bellows type or a diaphragm type is suitable. In these pumps, the gas contact portion can be limited to the bellows portion or the diaphragm portion. Thus, by considering the corrosion resistance of that portion, it can be safely used. In addition, it is desirable because sufficient sealing capacity to the external can be ensured and gas is hard to leak. The upper limits of the boosting capacities of those pumps are about 100 kPa to 300 kPa, which are somewhat low for pumps. However, since fluorine gas, which has high reactivity, is treated, those pumps are desirable because they do not bring about extremely pressure rising. Abnormalities that can occur in the pressurizer 13 include leak of gas and an abnormality of a motor. These can easily be detected from read values of a pressure gauge and a temperature gauge, which are normally attached to the pressurizer 13. On the other hand, when it is assumed that fluorine diluted with nitrogen gas or the like is used, an ejector to be driven by gas can be used in place of the pressurizer 13.

As shown in FIG. 1, the semiconductor manufacturing apparatus 3a includes a semiconductor manufacturing apparatus main body 33a and an abnormality detection sensor 34a in a casing 32a equipped with an exhaust mechanism 31a. The semiconductor manufacturing apparatus 3a further includes an abnormality judging device 35a, a signal transmitting/receiving device 36a, and a monitor 37a (display device) outside the casing 22a. The abnormality detection sensor 34a can detect an abnormality of the semiconductor manufacturing apparatus main body 33a or an abnormality of another part in the casing 32a or the like. The exhaust mechanism 31a includes a detector $31a_1$ that can detect leak of fluorine gas or hydrogen fluoride gas. Results in the detector $31a_1$ and the abnormality detection sensor 34a are sent as signals to the abnormality judging device 35a, which judges whether or not an abnormality such as leak of gas or breakdown occurs. When an abnormality has occurred, the signal transmitting/receiving device 36a sends out a signal to a predetermined device, gate valve, or the like. The signal transmitting/receiving device 36a can also receive an external signal. The monitor 37a converts back a gas storage quantity signal output from the signal transmitting/receiving device 17 and received by the signal transmitting/receiving device 36a into a pressure value to display an accurate gas storage quantity. Thereby, because gas must be stored within the limited capacity of the storage tank 12, usability and cost performance become easy to be compatible. Because such information is known in the semiconductor manufacturing apparatus, a gas supply deficiency in the course of the semiconductor manufacturing process can be prevented, and all products subjected to the process do not become defectives. The respective semiconductor manufacturing apparatuses 3b to 3e include semiconductor manufacturing apparatus main bodies 33b to 33e and abnormality detection sensors 34b to 34e in respective casings 32b to 32e equipped with exhaust mechanisms 31b to 31e having the same construction; and abnormality judging devices 35b to 35e, signal transmitting/receiving devices 36b to 36e, and monitors 37b to 37e (display devices) outside the respective casings 32b to 32e. Thus, the description thereof is omitted.

As shown in FIG. 1, the on-site fluorine gas generators 1a to 1e are connected to the gas supplying system 2 via pressure gauges 4a to 4e, pressure gauges 5a to 5e, and gate valves 7a to 7e provided between them, respectively. The semiconductor manufacturing apparatuses 3a to 3e are connected to the gas supplying system 2 via gate valves 15a to 15e provided in the gas supplying system 2, respectively.

Each of the gate valves 7a to 7e and 8a to 8e, the bypass gate valve 9, the inlet-side gate valve 10, the outlet-side gate valves 11a and 11b, and the gate valves 15a to 15c is an automatic valve, the opening and closing operations of which are controlled in accordance with instructions of a sequencer 200. The fluorine gas generators 1a to 1e and the semiconductor manufacturing apparatuses 3a to 3e can be freely combined with the gas supplying system. Although not shown, a nitrogen purge line or a gas exhaust line can be optionally provided to facilitate connection and disconnection of pipes. The use of those makes it easy to perform displacement of gas in connection, displacement of gas remaining in pipes in disconnection, and so on. Thus, connection between systems can be safely performed.

The pressure gauges 4a and 5a in this combination can detect the pressures on the fluorine gas generator 1a side and the gas supplying system 2 side of the gate valve 7a. The same applies to the respective combinations of the pressure gauges 4b to 4e and 5b to 5e.

From the viewpoint of ensuring safety of the semiconductor manufacturing plant 100, each of the on-site fluorine gas generator 1a, the gas supplying system 2, and the semiconductor manufacturing apparatus 3a is surrounded by a casing, which performs exhaust. In consideration of leak of gas, the pressure gauges 4a and 5a and the gate valve 7a may be contained in a lump in the casing of the on-site fluorine gas generator 1a or in the casing of the gas supplying system 2. As for the on-site fluorine gas generators 1b to 1e, the pressure gauges 4b to 4e and 5b to 5e, and the gate valves 7b to 7e, they are contained in the same combination in casings (not shown). The interior of the former casing is divided into some compartments such as fluorine gas generating and pressurizing compartments (not shown), each of which performs exhaust from the casing. The interior of the latter casing is divided into some compartments such as a fluorine gas storage compartment including a buffer tank whose volume has been optimized, each of which compartments performs exhaust from the casing. The concentration of fluorine gas is monitored in each exhaust air. When the gas is detected, it is decided that leak of gas has occurred in the target compartment. A controller (not shown) that is monitoring the fluorine gas concentrations in the exhaust airs then sends out an abnormality signal toward the sequencer 200. In the fluorine gas generators 1a to 1e, the gas supplying system 2, and the semiconductor manufacturing apparatuses 3a to 3e, leak of gas is a matter of concernment. Thus, when the event occurs, the operation of the target system component is stopped in accordance with a control instruction from the sequencer 200 to inspect. If necessary, maintenance/repair is performed. In the case of connecting a number of system components, the same applies to the respective combinations of the other on-site fluorine gas generators 1b to 1e, pressure gauges 4b to 4e and 5b to 5e, and gate valves 7b to 7e.

Next, the operation and control of each part and each apparatus in the semiconductor manufacturing plant 100 will be described with reference to FIGS. 2 to 7. FIG. 2 is a flowchart of a main routine of the semiconductor manufacturing plant according to the embodiment of the present invention. FIG. 3 is a flowchart of a processing routine in FIG. 2 for gas supply from the on-site fluorine gas generator 1a to the gate valves 9 and 10 in the gas supplying system 2. FIG. 4 is a flowchart of a processing routine in FIG. 2 for gas supply from the gas supplying system 2 to the semiconductor manufacturing apparatus 3a and semiconductor manufacture. FIG. 5 is a flowchart of a processing routine in FIG. 4 for gas supply from the gas supplying system 2 to the semiconductor manufacturing apparatus 3a. Instructions for the control are output from the above-described not-shown sequencer 200.

First, in the semiconductor manufacturing plant 100, the operational relation of only the on-site fluorine gas generator 1a, gas supplying system 2, and semiconductor manufacturing apparatus 3a will be described. When the semiconductor manufacturing plant 100 is started up, the sequencer 200 executes the main routine of FIG. 2 so that the semiconductor manufacturing plant 100 is put in a state that semiconductors can be manufactured.

Specifically, when the sequencer 200 executes the main routine and so on, as shown in FIG. 2, it is judged by using an abnormality detection sensor and an abnormality judging device provided in the casing of the gas supplying system 2 whether or not the gas supplying system 2 or another part in the casing of the gas supplying system 2 has an abnormality (S1). When the judgment result shows that there is no abnormality, the gate valves 9, 10, 11a, and 11b are permitted to be opened (S2). When there is an abnormality, the gate valves 8a, 9, 10, 11a, and 11b are forbidden from being opened (S3), and then the flow ends.

When the judgment result shows that there is no abnormality (S2), it is then judged by using the detector $21a_1$, the abnormality detection sensor 24a, and the abnormality judging device 25a whether or not the on-site fluorine gas generator 1a has an abnormality (S4). When the judgment result shows that there is no abnormality, the gate valve 8a is permitted to be opened (S5), and then processing is executed for gas supply from the on-site fluorine gas generator 1a to the gate valves 9 and 10 in the gas supplying system 2 (S6). When there is an abnormality, the gate valve 8a is forbidden from being opened (S7).

Processing of S6 for gas supply from the on-site fluorine gas generator 1a to the gate valves 9 and 10 in the gas supplying system 2 will be described in detail with reference to the routine of FIG. 3. Before the routine of FIG. 3 is executed, the fluorine gas generator 1a beforehand stores therein, under pressure, fluorine gas generated by electrolysis within the capacity of the generator 1a.

First, the abnormality judging device 25a sends a signal informing that the fluorine gas generator 1a has no abnormality, to the gate valve 8a via the signal transmitting/receiving device 17 to open the gate valve 8a (A2). Next, the pressure values of the pressure gauges 4a and 5a are compared with each other (A3). When the pressure value of the pressure gauge 4a is not more than the pressure value of the pressure gauge 5a, the flow returns to the main routine. When the pressure value of the pressure gauge 4a is more than the pressure value of the pressure gauge 5a, it is then judged by using the pressure gauge 14 whether or not the gas supply quantity to the storage tank 12 is already sufficient (A4). When it is sufficient, the flow returns to the main routine. When it is insufficient, the gate valve 7a is opened so as to supply fluorine gas to the storage tank 12 until the pressure value of the pressure gauge 4a becomes not more than the pressure value of the pressure gauge 5a (A5). The flow then returns to the main routine. The fluorine gas generator 1a capable of such an operation has no need of containing unnecessary gas, and thus can be made into the necessary minimum size. This can save the footprint when the fluorine gas generator 1a is equipped. In a semiconductor manufacturing factory, the unit land value is high because vast equipment is introduced such as building a clean room. Therefore, it is very important that the above footprint can be reduced as much as possible.

Next, it is judged by using the abnormality detection sensor 3a and the abnormality judging device 35a whether or not the semiconductor manufacturing apparatus 34a or another part in the casing 32 has an abnormality (S8). When the judgment result shows that there is no abnormality, the gate valve 15a is permitted to be opened (S9), and processing is executed for gas supply from the gas supplying system 2 to the semiconductor manufacturing apparatus 3a and semiconductor manufacture (S10). When there is an abnormality, the gate valve 15a is forbidden from being opened (S11). It is then judged whether or not the gate valve 8a is open (S12). When the gate valve 8a is open, it is closed (S13), and then the flow ends. When the gate valve 8a has been closed from the beginning, the flow ends with no process.

Processing of S10 for gas supply from the gas supplying system 2 to the semiconductor manufacturing apparatus 3a and semiconductor manufacture will be described in detail with reference to the routines of FIGS. 4 and 5.

First, as shown in FIG. 4, it is judged whether or not gas supply is required for semiconductor manufacture in the semiconductor manufacturing apparatus 3a (B1). When gas supply is not required, signals output from the arithmetic processor 18 are sent to the gate valves 7a, 8a, 9, 10, 11a, 11b, and 15a via the signal transmitting/receiving device 17 to close all opened valves of the gate valves 7a, 8a, 9, 10, 11a, 11b, and 15a. The flow then returns to the main routine. When gas supply is required for semiconductor manufacture, a signal output from the semiconductor manufacturing apparatus 3a is sent to the gate valve 15a via the signal transmitting/receiving device 17 to open the gate valve 15a (B2). Processing is then executed for gas supply from the gas supplying system 2 to the semiconductor manufacturing apparatus 3a (B3).

The gas supply process is represented by a routine as shown in FIG. 5. Specifically, first, a signal output from the semiconductor manufacturing apparatus 3a is sent to the gate valve 10 via the signal transmitting/receiving device 17 to open the gate valve 10 (C1). Next, the pressure in the storage tank 12 is monitored with the pressure gauge 14 (C2) to judge whether or not the pressure in the storage tank 12 is within the range from the maximum to the lower limit of the operation of the mass flow controller (MFC) (C3). When the pressure in the storage tank 12 is within the range from the maximum to the lower limit of the operation of the mass flow controller (MFC), a signal output from the pressure gauge 14 is sent to the gate valve 11a via the signal transmitting/receiving device 17 to open the gate valve 11a. Thereby, gas is supplied to the semiconductor manufacturing apparatus 3a (C4). The flow then returns to the routine of FIG. 4. When the pressure in the storage tank 12 is not within the range from the maximum to the lower limit of the operation of the mass flow controller (MFC), it is judged whether or not gas in the storage tank 12 is supplied to the semiconductor manufacturing apparatus 3a by using the pressurizer 13 (C5). When gas is supplied by using the pressurizer 13, a signal output from the sequencer 200 is sent to the gate valve 11b via the signal transmitting/receiving device 17 to open the gate valve 11b. Thereby, gas is supplied to the semiconductor manufacturing apparatus 3a (C6). The flow then returns to the routine of FIG. 4. When the processes of C4 and C6 are executed, not only the pressure gauge 14 but also the pressure gauge 6 is used to monitor the pressure in the storage tank 12. When gas is not supplied by using the pressurizer 13, a signal output from the sequencer 200 is sent to the gate valve 10 via the signal transmitting/receiving device 17 to close the gate valve 10; and another signal output from the sequencer 200 is sent to the gate valve 9 via the signal transmitting/receiving device 17 to open the gate valve 9 (C7). Thereby, gas is supplied from the fluorine gas generator 1a to the semiconductor manufacturing apparatus 3a via the bypass 16 (C8). The flow then returns to the routine of FIG. 4.

In the semiconductor manufacturing apparatus 3a to which gas is being supplied, processing for semiconductor manufacture is executed (B4). When the semiconductor manufacturing process is completed (B5), signals output from the sequencer 200 are sent to the gate valves 7a, 8a, 9, 10, 11a, 11b, and 15a via the signal transmitting/receiving device 17 to close all opened valves of the gate valves 7a, 8a, 9, 10, 11a, 11b, and 15a. The flow then returns to the main routine.

The same applies to a case of using any of the on-site fluorine gas generators 1b to 1e in place of the on-site fluorine gas generator 1a. The same also applies to a case of using any of the semiconductor manufacturing apparatuses 3b to 3e in place of the semiconductor manufacturing apparatus 3a. Further, even in the case of the semiconductor manufacturing plant 100 to which a number of on-site fluorine gas generators and a number of semiconductor manufacturing apparatuses are connected, the same operation as described above can be performed.

In such a semiconductor manufacturing plant 100, even when some of the on-site fluorine gas generators 1a to 1e are stopped for maintenance or due to an emergency, a predetermined quantity of fluorine gas (for example, corresponding to the time required for the maintenance or recovery of the emergency stop) has been stored in the storage tank 12, and the fluorine gas can be supplied to the semiconductor manufacturing apparatuses 3a to 3e with controlling the pressure. Therefore, the semiconductor manufacturing apparatuses 3a to 3e can be operated without stopping with minimizing the variation in pressure load. As a result, fluorine gas generated in the fluorine gas generators 1a to 1e can be safely and stably supplied to the semiconductor manufacturing apparatuses 3a to 3e. Further, because the semiconductor manufacturing apparatuses 3a to 3e need not be stopped during maintenance of the on-site fluorine gas generators 1a to 1e or the like, the semiconductor manufacturing apparatuses 3a to 3e can be continuously operated. Thus, the cost performance in semiconductor manufacture becomes superior.

In addition, fluorine gas generator pressure detectors can prevent gas from counterflowing from the gas supplying system 2 to the on-site fluorine gas generators 1a to 1e. This prevents inhibition of gas supply from the gas supplying system 2 to the semiconductor manufacturing apparatuses 3a to 3e. Further, when a system component has an abnormality, the system component can be disconnected by closing the corresponding gate valve. This prevents erroneous operations of the other normal system components and second accidents.

Example

Hereinafter will be described an example of control by a sequencer 200 in an operation condition of a semiconductor manufacturing plant having the same construction as the above-described semiconductor manufacturing plant 100. For convenience, parts having the same constructions as those of the above-described semiconductor manufacturing plant 100 will be described by using the same reference numerals as those of the above-described semiconductor manufacturing plant 100, respectively.

In the initial condition, any valve is closed. In the gas supplying system 2, when gas is being supplied via the storage tank 12, the gate valves 7a to 7e are opened/closed in accordance with the gas pressure conditions in the on-site fluorine gas generators 1a to 1e; the gate valves 8a to 8e are opened unless an abnormality signal is issued from the on-site fluorine gas generators 1a to 1e; the gate valves 10 and 11a are opened; and the gate valves 15a to 15e are opened/closed in accordance with gas supply request signals of the semiconductor manufacturing apparatuses 3a to 3e.

The pressure gauge 6 has a function of monitoring the pressure in the storage tank 12 or pipes, and in accordance with the pressure, sending out, toward the sequencer 200, signals of (1) full storage; (2) partial use; (3) reduction I (difficult to supply); and (4) reduction II (impossible to supply). The signal of (1) full storage indicates that the pressure of the gas stored in the storage tank 12 is the upper limit pressure value; the signal of (2) partial use indicates that the pressure of the gas stored in the storage tank 12 has become a pressure value when the stored gas has been reduced from the full storage condition by a quantity corresponding to the use quantity in the semiconductor manufacturing apparatuses 3a to 3e per one time or one day; the signal of (3) reduction I (difficult to supply) indicates that the pressure of the gas stored in the storage tank 12 has become a pressure value corresponding to the use quantity in the semiconductor manufacturing apparatuses 3a to 3e per one time or one day; and the signal of (4) reduction II (impossible to supply) indicates that the pressure of the stored gas has become a pressure value corresponding to the lower limit of supply to the semiconductor manufacturing apparatuses 3a to 3e. They have been determined from the use quantity per one time or one day on the basis of the specifications of the semiconductor manufacturing apparatuses 3a to 3e. In advance, the gas supplying system 2 sent out information on them toward the semiconductor manufacturing apparatuses 3a to 3e. On the semiconductor manufacturing apparatuses 3a to 3e side, operations are performed after checking in consideration of the gas storage quantity in the gas supplying system 2 whether or not there is a problem on performing semiconductor manufacturing processes.

The not-shown sequencer 200 has a function of receiving the signals of (1) full storage; (2) partial use; (3) reduction I (difficult to supply); and (4) reduction II (impossible to supply) sent out from the pressure gauge 6. The sequencer 200 can send the signals to the semiconductor manufacturing apparatuses 3a to 3e. As the fluorine gas pressure lowers, the signal changes in the order of (1), (2), (3), and (4). When the gas supply capacity of the on-site fluorine gas generators 1a to 1e is compared with the gas consumption capacity of the semiconductor manufacturing apparatuses 3a to 3e, the former is supposed to exceed the latter in the normal operation. Under this condition, the signal sent out from the pressure gauge 6 alternates between (1) and (2). When the gas supply capacity of the on-site fluorine gas generators 1a to 1e is compared with the gas consumption capacity of the semiconductor manufacturing apparatuses 3a to 3e, if the latter exceeds the former, the signal may change into (3) or (4).

When the gas supplying system 2 requires some kind of maintenance, the system is changed into a maintenance mode, in which fluorine gas is supplied from one of the on-site fluorine gas generators 1a to 1e that can supply gas, to the semiconductor manufacturing apparatuses 3a to 3e that require gas, by bypassing the gas supplying system 2. Because this control is possible, the gas supply path can quickly be changed when the gas supplying system 2 is stopped. Therefore, the semiconductor manufacturing apparatuses 3a to 3e can be continuously operated without interrupting the semiconductor manufacturing processes in the semiconductor manufacturing apparatuses 3a to 3e.

More specifically, when gas is being supplied through a path bypassing the storage tank 12 in the gas supplying system 2, the gate valves 7a to 7e are opened/closed in accordance with the gas pressure conditions of the on-site fluorine gas generators 1a to 1e; the gate valves 8a to 8e are opened unless an abnormality signal is issued from the on-site fluorine gas generators 1a to 1e; the gate valves 10, 11a, and 11b are closed; and the gate valve 9 in the bypass is opened. The gate valves 15a to 15e are opened/closed in accordance with gas supply request signals of the semiconductor manufacturing apparatuses.

In a modification, information on the conditions (maintenance mode) of the on-site fluorine gas generators 1a to 1e and the storage tank 12 sent from the sequencer 200 may be always displayed on display devices (not shown) connected with the semiconductor manufacturing apparatuses 3a to 3e.

In another modification, the sequencer 200 may take therein signals indicating those conditions to grasp the gas supply conditions in the semiconductor manufacturing plant 100. During going to a state that gas is difficult to supply, the sequencer 200 may give notice so that some measure such as adjustment of the gas use quantity can be taken.

Provision of the pressurizer 13 on a stage subsequent to the gas supplying system 2 can improve the gas supply capacity. When the pressure of the gas stored in the storage tank 12 is sufficiently high (in a state of the above-described full storage, partial use, or the like), the gas can be naturally supplied by its own pressure. When the pressure of the gas has lowered to a state that the gas is difficult or impossible to be supplied only by its own pressure toward the semiconductor manufacturing apparatuses 3a to 3e (in a state that the above described reduction I (difficult to supply), reduction II (impossible to supply), or the like), pressure rising by the pressurizer 13 is required. For this reason, as shown in FIG. 1, the gas supplying system 2 is provided with a pipe (first path) having an outlet-side gate valve 11a for supplying gas by its own pressure, and a pipe (second path) having an outlet-side gate valve 11b for supplying gas by using the pressurizer 13. When gas is supplied by its own pressure, the outlet-side gate valve 11a is opened and the outlet-side gate valve 11b is closed so as not to operate the pressurizer 13. When gas is supplied by using the pressurizer 13, the outlet-side gate valve 11b is opened and the pressurizer 13 is operated so that gas remaining in the storage tank 12 is sucked out and supplied toward the semiconductor manufacturing apparatuses 3a to 3e. This makes it possible to further supply gas in the storage tank 12 after completion of gas supply by the gas own pressure.

Each of the fluorine gas generators 1a to 1e further has a function of outputting toward the sequencer 200 an abnormality signal b indicating that gas supply has become impossible to a related apparatus when the generator has become impossible to supply gas due to maintenance or an abnormality. The sequencer 200 having received no abnormality signal b from the fluorine gas generators 1a to 1e instructs the gas supplying system 2 to open the gate valves 8a to 8e in the gas supplying system 2, and thereby each valve is put in an open state.

Whether or not the fluorine gas generators 1a to 1e can supply gas to the storage tank 12 is judged by using the pressure gauges 4a to 4e and the pressure gauges 5a to 5e respectively provided upstream and downstream of the gate valves 7a to 7e, as shown in FIG. 1. The pressure differences between the pressure gauges (for example, the difference in pressure value between the pressure gauges 4a and 5a) are monitored. On the basis of the information, the sequencer 200 opens/closes the gate valves 7a to 7e so as to supply gas toward the subsequent gas supplying system 2.

In the case that the fluorine gas pressures in the on-site fluorine gas generators 1a to 1e are low, even when the on-site fluorine gas generators 1a to 1e are operating to generate gas, actually the gas cannot be supplied to the subsequent gas supply system 2. In this state, if the gate valves 7a to 7e are opened without discretion to connect the on-site fluorine gas generators 1a to 1e with the gas supplying system 2, the gas supplying system 2 exceeds the on-site fluorine gas generators 1a to 1e in gas supply capacity. As a result, gas counterflows from the gas supplying system 2 to the on-site fluorine gas generators 1a to 1e. This phenomenon may inhibit gas supply from the gas supplying system 2 to the semiconductor manufacturing apparatuses 3a to 3e. This is a problem that affects semiconductor manufacturing processes.

Specifically, conditions for opening/closing the gate valves 7a to 7e are as follows.

(When the read values of the pressure gauges 4a to 4e>the read values of the pressure gauges 5a to 5e)

It is decided that a sufficient amount of gas to be supplied to the subsequent stage is generated in the on-site fluorine gas generators 1a to 1e, and the gate valves 7a to 7e are kept opened. Or, when the read values of the pressure gauges have become those conditions when the gate valves 7a to 7e are closed, the gate valves 7a to 7e are opened.

(When the read values of the pressure gauges 4a to 4e=the read values of the pressure gauges 5a to 5e)

When the read values of the pressure gauges have become those conditions when the gate valves 7a to 7e are closed, the gate valves 7a to 7e are kept closed. When the read values of the pressure gauges have become those conditions when the gate valves 7a to 7e are opened, the state is kept for a certain time. The certain time is a unit time such as one minute, three minutes, or five minutes. After the unit time elapses, the gate valves 7a to 7e are closed.

(When the read values of the pressure gauges 4a to 4e<the read values of the pressure gauges 5a to 5e)

It is decided that a sufficient amount of gas to be supplied to the subsequent stage is not generated in the on-site fluorine gas generators 1a to 1e, and the gate valves 7a to 7e are not opened. Or, when the read values of the pressure gauges have become those conditions when the gate valves 7a to 7e are opened, the gate valves 7a to 7e are closed.

In the above construction, when the on-site fluorine gas generators 1a to 1e have been started up, they contain therein a sufficient amount of fluorine gas that can be supplied. Therefore, a supply availability deciding unit can decide that gas can be supplied. In this case, gas can be supplied toward the storage tank 12. When the on-site fluorine gas generators 1a to 1e do not contain therein a sufficient amount of fluorine gas, it can be decided to disconnect them from the gas supplying system 2.

When regular or nonregular maintenance is performed for the on-site fluorine gas generators 1a to 1e, gas supply from an on-site fluorine gas generator must be stopped for about one to three days. Instead of that, gas stored in the storage tank 12 is supplied. In this case, if the semiconductor manufacturing apparatuses 3a to 3e are used without recognizing that the gas supply source has been switched over, in particular, when some apparatuses irregularly consume gas, insufficient supply may occur. When insufficient gas supply occurs, the sequencer 200 stops the operations of the semiconductor manufacturing apparatuses 3a to 3e even in the way of a sequence of manufacturing processes preprogrammed. In this case, all Si wafers contained in the semiconductor manufacturing apparatuses 3a to 3e to which gas is supplied are considered to be defectives. The loss in the semiconductor manufacturing factory is never little.

Each of the on-site fluorine gas generators 1a to 1e has a function of outputting an abnormality signal b indicating that gas supply is impossible, when the generator has become impossible to supply gas. In the semiconductor manufacturing plant 100, a function may be provided of receiving an abnormality signal b sent out from each of the on-site fluorine gas generators 1a to 1e so that existence of one of the on-site fluorine gas generators 1a to 1e that has become impossible to supply gas can be displayed on, for example, a controller including the sequencer 200. This system having received an abnormality signal b sent out from one of the on-site fluorine gas generators 1a to 1e that has become abnormal closes one of the gate valves 8a to 8e corresponding to the abnormal on-site fluorine gas generator. By stopping gas supply of one on-site fluorine gas generator, the gas supply capacity lowers accordingly. However, using gas remaining in the storage tank 12 and gas supplied from the other fluorine gas generators, a predetermined amount of gas is supplied toward the semiconductor manufacturing apparatuses 3a to 3e.

When some abnormality (for example, leak of gas) has occurred in the semiconductor manufacturing apparatuses 3a to 3e, continuance of gas supply from the gas supplying system 2 may bring about a second accident.

It is supposed that each of the semiconductor manufacturing apparatuses 3a to 3e has a function of being able to send out a supply request signal toward the sequencer 200 when the apparatus requires fluorine gas. The sequencer 200 having received a supply request signal from one of the semiconductor manufacturing apparatuses 3a to 3e instructs one of the gate valves 15a to 15e corresponding to the one of the semiconductor manufacturing apparatuses 3a to 3e that has sent out the supply request signal, to open, and thereby the corresponding gate valve is opened. When the semiconductor manufacturing apparatuses 3a to 3e having abnormality sends out an abnormality signal c and the sequencer 200 receives the signal, the sequencer 200 controls the gate valves 15a to 15e to be closed or to be forbidden to open. Thereby, when the semiconductor manufacturing apparatuses 3a to 3e have abnormality, fluorine gas is forbidden to be supplied. Therefore, no risky condition is brought about, and in addition, there is no possibility that gas stored in the storage tank 12 is contaminated.

The present invention can be changed in design within the scope not deviating from the claims, and is never limited to the above-described embodiment and example. For example, in the above-described embodiment and example, a number of fluorine gas generators and a number of semiconductor manufacturing apparatuses are provided. However, it suffices if one or more fluorine gas generators and one or more semiconductor manufacturing apparatuses are provided.

Figure 1:
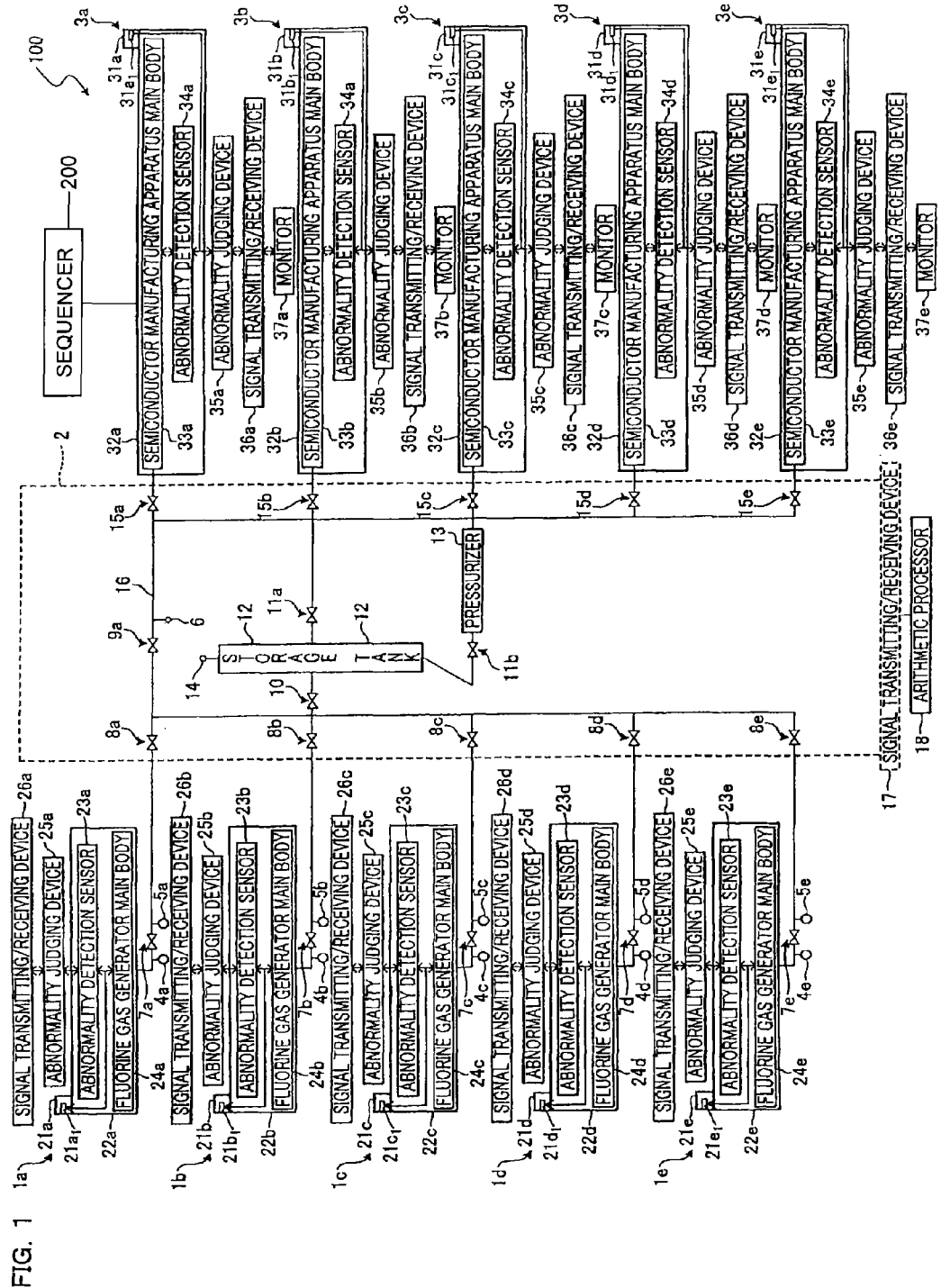
FIG. 1 A schematic diagram of a principal part of a semiconductor manufacturing plant according to an embodiment of the present invention.
Figure 2:
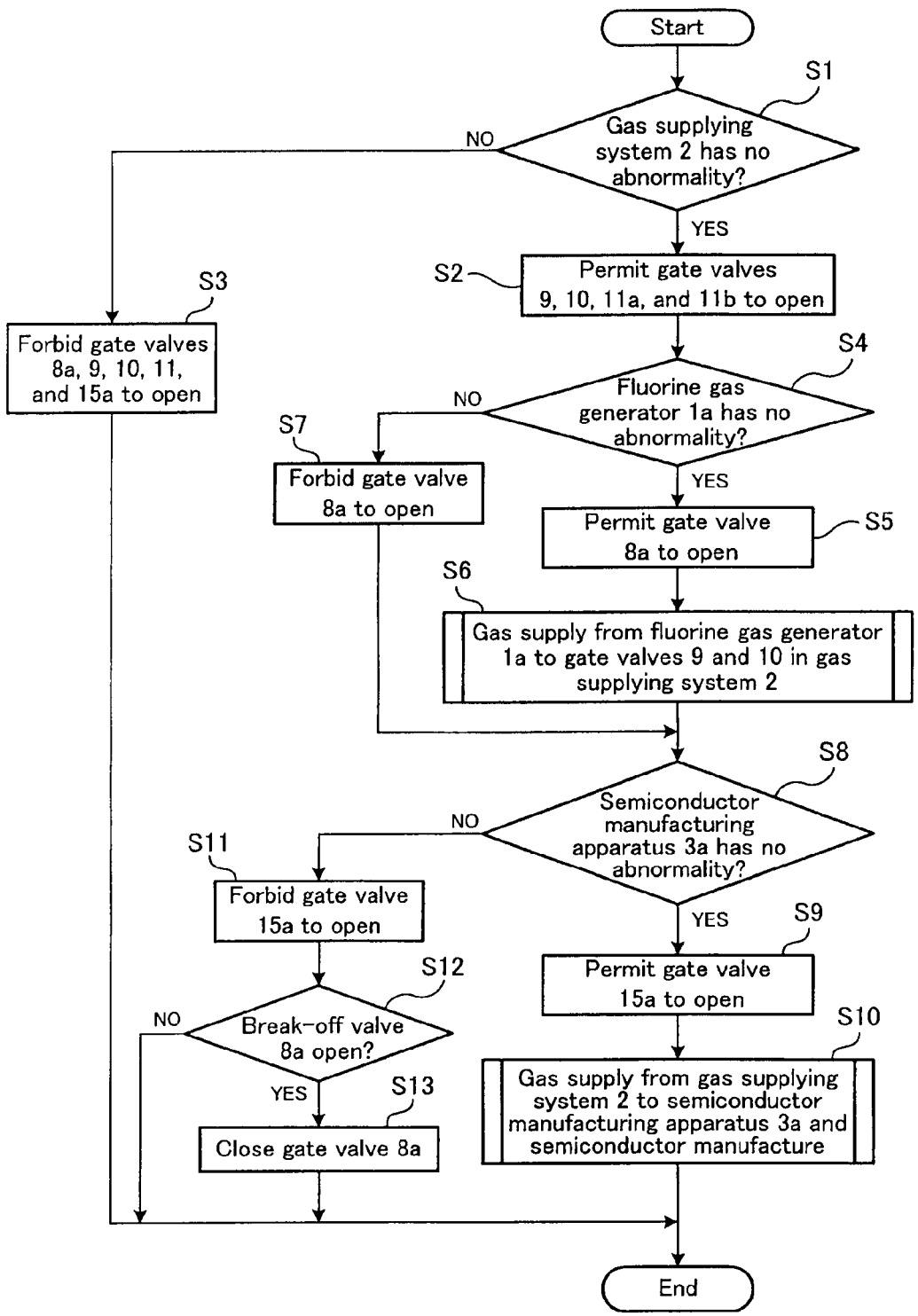
FIG. 2 A flowchart of a main routine of the semiconductor manufacturing plant according to the embodiment of the present invention.
Figure 3:
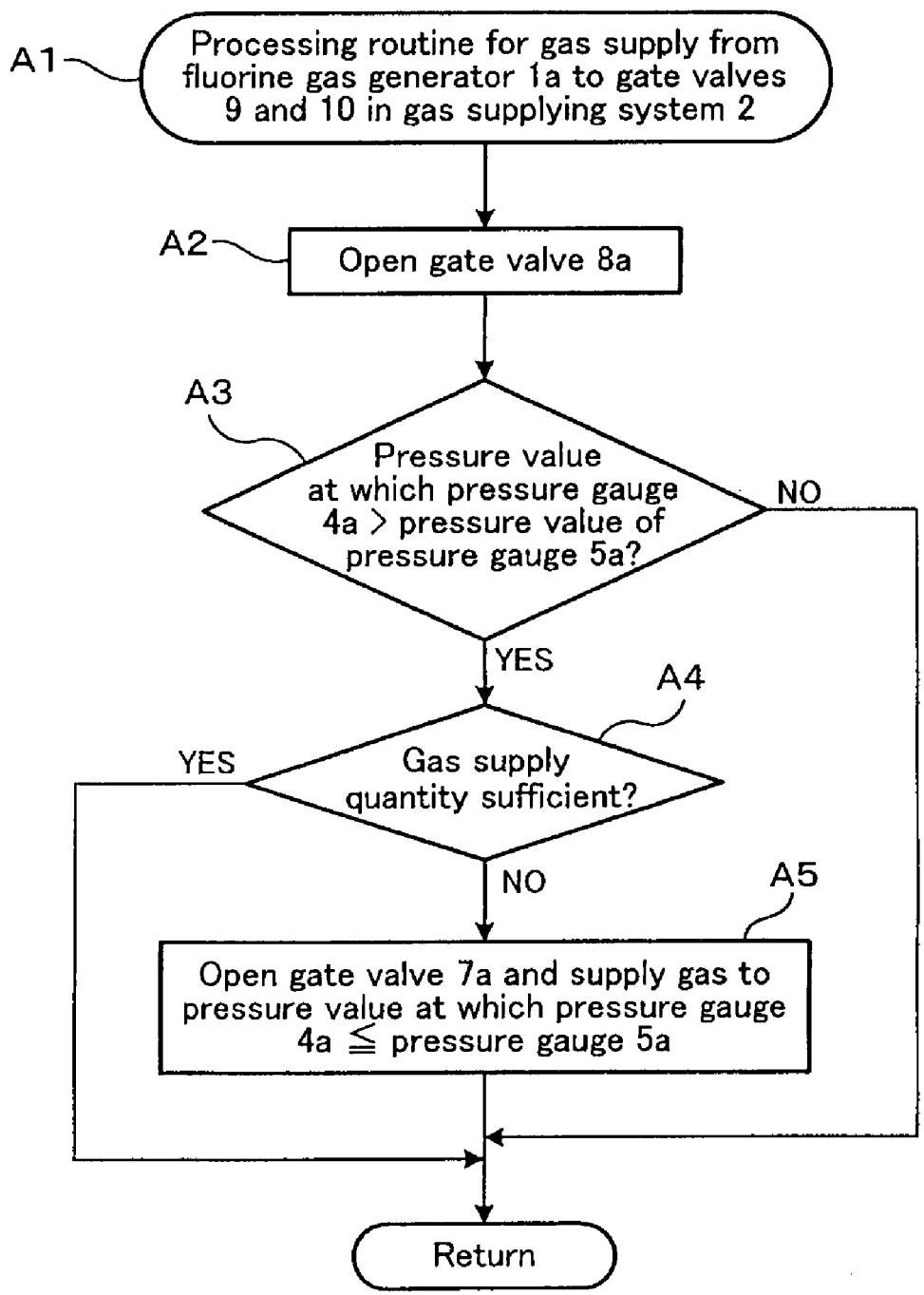
FIG. 3 A flowchart of a processing routine for gas supply from an on-site fluorine gas generator 1a to gate valves 9 and 10 of a gas supplying system 2 in FIG. 2.
Figure 4:
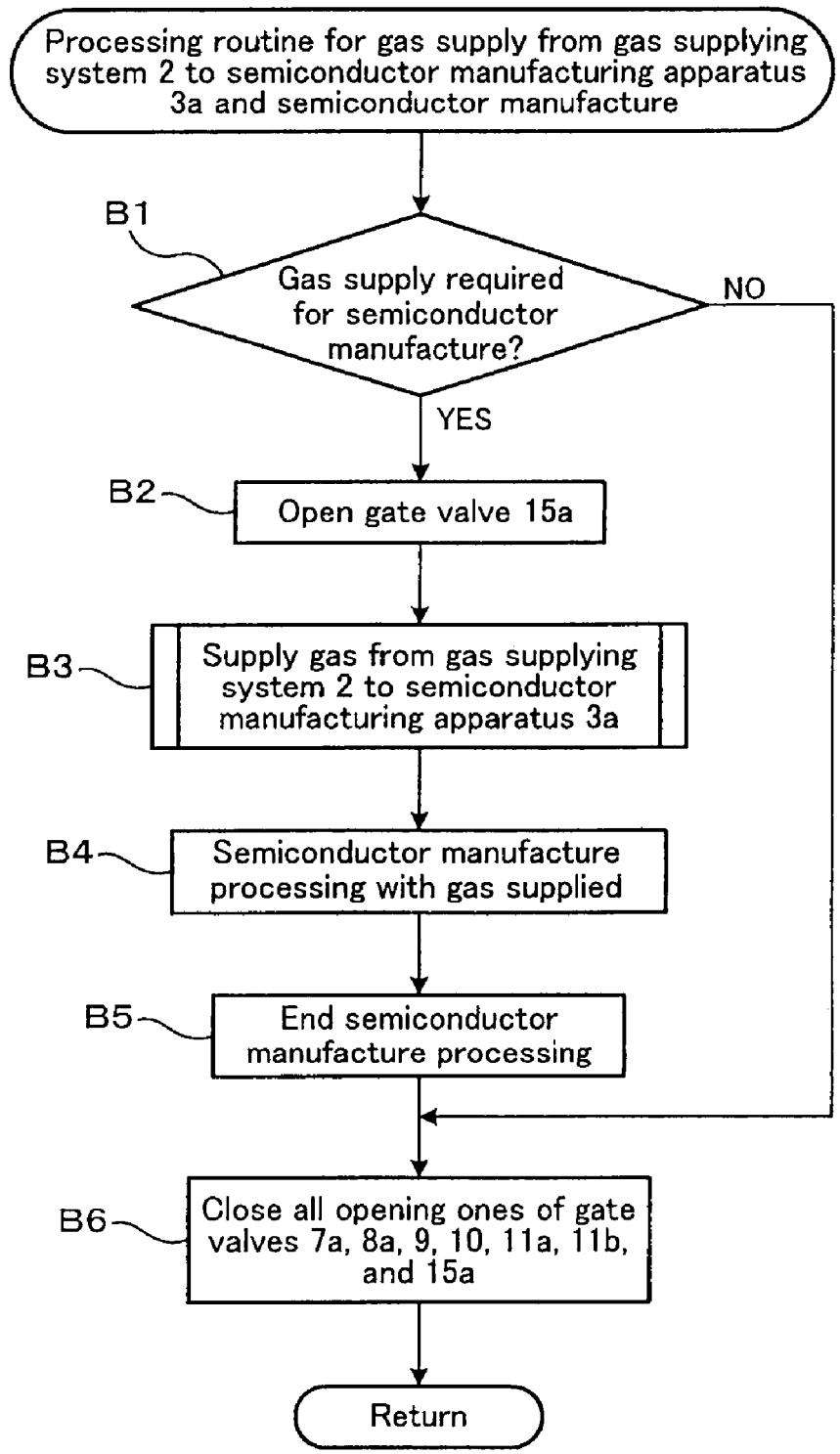
FIG. 4 A flowchart of a processing routine for gas supply from the gas supplying system 2 to a semiconductor manufacturing apparatus 3a and semiconductor manufacture in FIG. 2.
Figure 5:
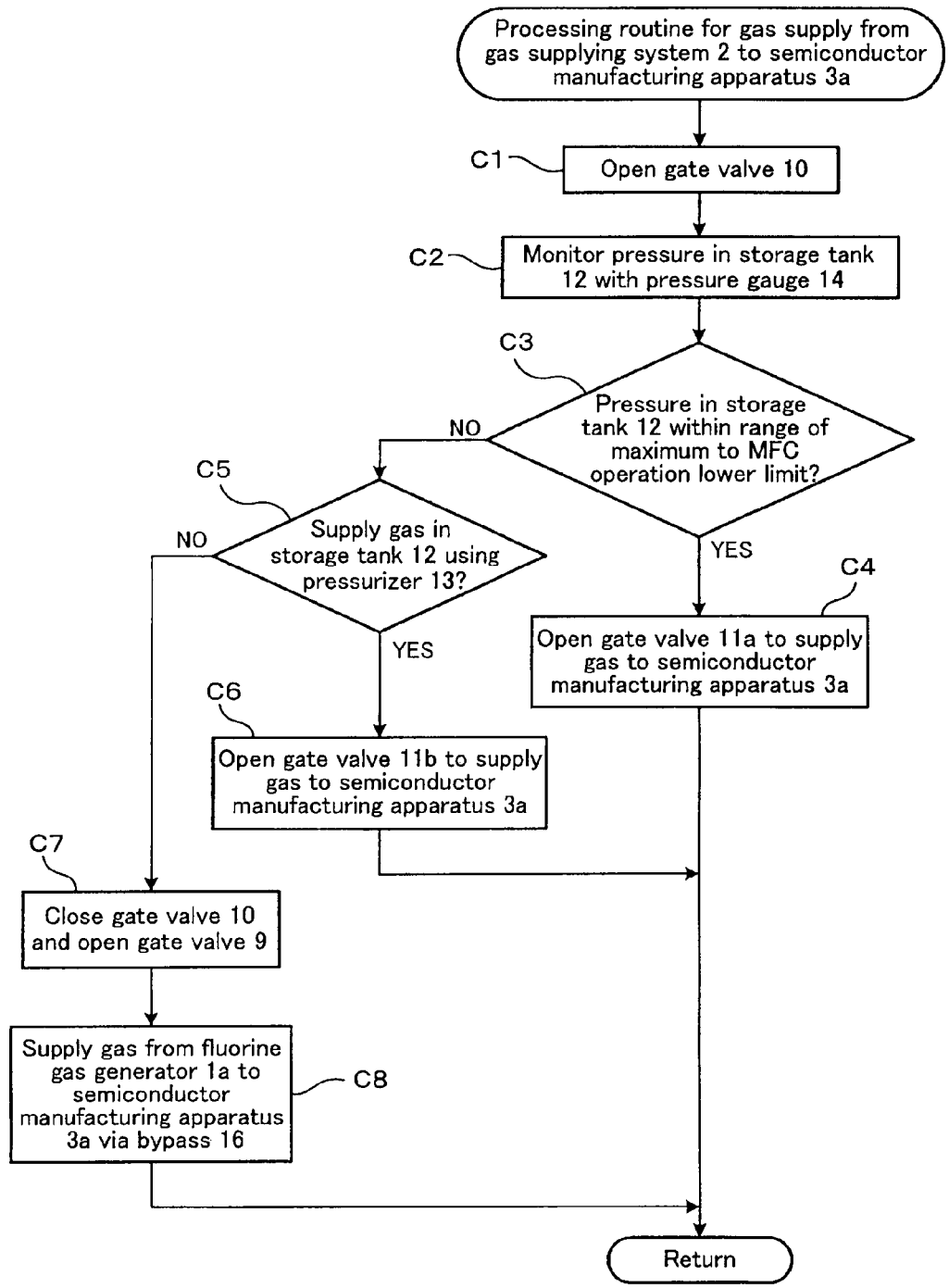
FIG. 5 A flowchart of a processing routine for gas supply from the gas supplying system 2 to the semiconductor manufacturing apparatus 3a in FIG. 4.

DESCRIPTION OF REFERENCE NUMERALS 1a, 1b, 1c, 1d, 1e: on-site fluorine gas generator
2: gas supplying system
3a, 3b, 3c, 3d, 3e: semiconductor manufacturing apparatus
4a, 4b, 4c, 4d, 4e, 5a, 5b, 5c, 5d, 5e, 6, 14: pressure gauge
7a, 7b, 7c, 7d, 7e, 8a, 8b, 8c, 8d, 8e, 15a, 15b, 15c, 15d, 15e: gate valve
9: bypass gate valve
10: inlet-side gate valve
11a, 11b: outlet-side gate valve
12: storage tank
13: pressurizer 16: bypass
17: signal transmitting/receiving device
18: arithmetic processor
21a, 21b, 21c, 21d, 21e, 31a, 31b, 31c, 31d, 31e: exhaust mechanism
$21a_1, 21b_1, 21c_1, 21d_1, 21e_1, 31a_1, 31b_1, 31c_1, 31d_1, 31e_1$: detector
22a, 22b, 22c, 22d, 22e, 32a, 32b, 32c, 32d, 32e: casing
24a, 24b, 24c, 24d, 24e: fluorine gas generator main body
23a, 23b, 23c, 23d, 23e, 34a, 34b, 34c, 34d, 34e: abnormality detection sensor
25a, 25b, 25c, 25d, 25e, 35a, 35b, 35c, 35d, 35e: abnormality judging device
26a, 26b, 26c, 26d, 26e, 36a, 36b, 36c, 36d, 36e: signal transmitting/receiving device
33a, 33b, 33c, 33d, 33e: semiconductor manufacturing apparatus main body
37a, 37b, 37c, 37d, 37e: monitor
100: semiconductor manufacturing plant

The invention claimed is:

1. A semiconductor manufacturing plant,
wherein at least one fluorine gas generator is connected with at least one semiconductor manufacturing apparatus through a gas supplying system including a storage tank that can store therein a predetermined quantity of fluorine gas generated in the fluorine gas generator, and
fluorine gas is supplied from the storage tank, which stores therein a predetermined quantity of fluorine gas, to the semiconductor manufacturing apparatus so as to keep the operation of the semiconductor manufacturing apparatus when the fluorine gas generator is stopped,
wherein the gas supplying system comprises an inlet-side gate valve and an outlet-side gate valve respectively provided upstream and downstream of the storage tank; a bypass interconnecting the fluorine gas generator and the semiconductor manufacturing apparatus with bypassing the storage tank; a bypass gate valve provided in the middle of the bypass; and a gate valve controlling unit that controls the respective gate valves, and
the gate valve controlling unit performs control to close the bypass gate valve and open the inlet- and outlet-side gate valves so as to supply gas via the storage tank to the semiconductor manufacturing apparatus that requires gas, when the gas supplying system is in a normal operation; and performs control to switch the gas supplying system into a maintenance mode, close the inlet- and outlet-side gate valves, and open the bypass gate valve so as to supply gas from the fluorine gas generator that can supply gas, to the semiconductor manufacturing apparatus that requires gas, with bypassing the storage tank when the gas supplying system is stopped due to maintenance or a breakdown.

2. A semiconductor manufacturing plant,
wherein a plurality of fluorine gas generators are connected with a plurality of semiconductor manufacturing apparatus through a gas supplying system including a storage tank that can store therein a predetermined quantity of fluorine gas generated in the fluorine gas generators,
fluorine gas is supplied from the storage tank, which stores therein a predetermined quantity of fluorine gas, to the semiconductor manufacturing apparatus so as to keep the operation of the semiconductor manufacturing apparatus when the fluorine gas generators are stopped,
wherein a fluorine gas generator gate valve is provided between each fluorine gas generator and the gas supplying system,
a fluorine gas generator pressure detecting unit is respectively provided upstream and downstream of each fluorine gas generator gate valve, and
the plant further comprises a gas supply availability deciding unit that monitors the difference in pressure value between each fluorine gas generator and the gas supplying system detected by the respective fluorine gas generator pressure detecting unit so as to decide availability of fluorine gas supply from each fluorine gas generator to the storage tank.

3. A semiconductor manufacturing plant,
wherein a plurality of fluorine gas generators are connected with a plurality of semiconductor manufacturing apparatus through a gas supplying system including a storage tank that can store therein a predetermined quantity of fluorine gas generated in the fluorine gas generators,
fluorine gas is supplied from the storage tank, which stores therein a predetermined quantity of fluorine gas, to the semiconductor manufacturing apparatus so as to keep the operation of the semiconductor manufacturing apparatus when the fluorine gas generators are stopped,
wherein each fluorine gas generator comprises a fluorine gas generator judging unit that sends out an abnormality signal on the basis of a signal from a sensor provided in the fluorine gas generator when the sensor detects an internal abnormality,
the gas supplying system comprises a fluorine gas generator abnormality signal receiving unit that receives the abnormality signal sent out from the fluorine gas generator judging unit, and
the fluorine gas generator abnormality signal receiving unit sends a signal to the fluorine gas generator gate valve to be closed between the gas supplying system and each fluorine gas generator when the fluorine gas generator abnormality signal receiving unit receives an abnormality signal sent from the fluorine gas generator judging unit.

4. A semiconductor manufacturing plant,
wherein a plurality of fluorine gas generators are connected with a plurality of semiconductor manufacturing apparatus through a gas supplying system including a storage tank that can store therein a predetermined quantity of fluorine gas generated in the fluorine gas generators,
fluorine gas is supplied from the storage tank, which stores therein a predetermined quantity of fluorine gas, to the semiconductor manufacturing apparatus so as to keep the operation of the semiconductor manufacturing apparatus when the fluorine gas generators are stopped,
wherein a semiconductor manufacturing apparatus gate valve is provided between each semiconductor manufacturing apparatus and the gas supplying system,
each of the semiconductor manufacturing apparatus comprises a semiconductor manufacturing apparatus judging unit that generates an abnormality signal on the basis of a signal from a sensor provided in the semiconductor manufacturing apparatus when the sensor detects an internal abnormality,
the gas supplying system comprises a semiconductor manufacturing apparatus abnormality signal receiving unit that receives the abnormality signal sent out from the semiconductor manufacturing apparatus judging unit, and
the semiconductor manufacturing apparatus abnormality signal receiving unit sends a signal to the semiconductor manufacturing apparatus gate valve to be closed when the semiconductor manufacturing apparatus abnormality signal receiving unit receives an abnormality signal sent out from the semiconductor manufacturing apparatus judging unit.

5. A semiconductor manufacturing plant wherein at least one fluorine gas generator is connected with at least one semiconductor manufacturing apparatus through a gas supplying system including a storage tank that can store therein a predetermined quantity of fluorine gas generated in the fluorine gas generator, and fluorine gas is supplied from the storage tank, which stores therein a predetermined quantity of fluorine gas, to the semiconductor manufacturing apparatus so as to keep the operation of the semiconductor manufacturing apparatus when the fluorine gas generator is stopped, wherein the gas supplying system further comprises:

a first path having a first storage tank gate valve in the middle of the path, through which fluorine gas can be supplied by its own pressure in the storage tank to the semiconductor manufacturing apparatus;

a second path having, in the middle of the path, a pressure controlling unit that controls the gas outlet pressure from the storage tank, and a second storage tank gate valve provided between the pressure controlling unit and the storage tank;

a path pressure detecting unit provided in a path between the storage tank and the semiconductor manufacturing apparatus or in the second path so as to be able to detect the pressure in the first or second path;

a path controlling unit that controls switching between the first and second paths in accordance with the pressure value detected by the path pressure detecting unit; and an operation controlling unit that controls the operation of the pressure controlling unit when the path is switched by the path controlling unit into the second path.

6. A semiconductor manufacturing plant wherein at least one fluorine gas generator is connected with at least one semiconductor manufacturing apparatus through a gas supplying system including a storage tank that can store therein a predetermined quantity of fluorine gas generated in the fluorine gas generator, and fluorine gas is supplied from the storage tank, which stores therein a predetermined quantity of fluorine gas, to the semiconductor manufacturing apparatus so as to keep the operation of the semiconductor manufacturing apparatus when the fluorine gas generator is stopped wherein each of the fluorine gas generator, the gas supplying system, and the semiconductor manufacturing apparatus is contained in a casing equipped with an exhaust mechanism, and each exhaust mechanism comprises a fluorine gas or hydrogen fluoride gas detector that detects fluorine gas or hydrogen fluoride gas.

7. A semiconductor manufacturing plant wherein at least one fluorine gas generator is connected with at least one semiconductor manufacturing apparatus through a gas supplying system including a storage tank that can store therein a predetermined quantity of fluorine gas generated in the fluorine gas generator, and fluorine gas is supplied from the storage tank, which stores therein a predetermined quantity of fluorine gas, to the semiconductor manufacturing apparatus so as to keep the operation of the semiconductor manufacturing apparatus when the fluorine gas generator is stopped wherein the gas supplying system comprises a pressure monitoring unit that detects the pressure in the storage tank to detect the storage quantity of the storage tank by the value of the detected pressure; a pressure value converting unit that converts the pressure value into a signal; and a signal transmitting unit that outputs toward the semiconductor manufacturing apparatus the signal converted by the pressure value converting unit, and the semiconductor manufacturing apparatus comprises a signal receiving unit that receives the signal from the signal transmitting unit; a signal converting unit that converts into a pressure value the signal received by the signal receiving unit; and a displaying unit that displays the pressure value derived by the signal converting unit.

8. The semiconductor manufacturing plant according to claim 7, wherein the gas supplying system comprises an inlet-side gate valve and an outlet-side gate valve respectively provided upstream and downstream of the storage tank; a bypass interconnecting the fluorine gas generator and the semiconductor manufacturing apparatus with bypassing the storage tank; a bypass gate valve provided in the middle of the bypass; and a gate valve controlling unit that controls the respective gate valves, and the gate valve controlling unit performs control to close the bypass gate valve and open the inlet- and outlet-side gate valves so as to supply gas via the storage tank to the semiconductor manufacturing apparatus that requires gas, when the gas supplying system is in a normal operation; and performs control to switch the gas supplying system into a maintenance mode, close the inlet- and outlet-side gate valves, and open the bypass gate valve so as to supply gas from the fluorine gas generator that can supply gas, to the semiconductor manufacturing apparatus that requires gas, with bypassing the storage tank when the gas supplying system is stopped due to maintenance or a breakdown.

9. The semiconductor manufacturing plant according to claim 7, further comprising:

a plurality of fluorine gas generators; and a plurality of semiconductor manufacturing apparatus, wherein a fluorine gas generator gate valve is provided between each fluorine gas generator and the gas supplying system, a fluorine gas generator pressure detecting unit is respectively provided upstream and downstream of each fluorine gas generator gate valve, and the plant further comprises a gas supply availability deciding unit that monitors the difference in pressure value between each fluorine gas generator and the gas supplying system detected by the respective fluorine gas generator pressure detecting unit so as to decide availability of fluorine gas supply from each fluorine gas generator to the storage tank.

10. The semiconductor manufacturing plant according to claim 7, further comprising:

a plurality of fluorine gas generators; and a plurality of semiconductor manufacturing apparatus, wherein each fluorine gas generator comprises a fluorine gas generator judging unit that sends out an abnormality signal on the basis of a signal from a sensor provided in the fluorine gas generator when the sensor detects an internal abnormality, the gas supplying system comprises a fluorine gas generator abnormality signal receiving unit that receives the abnormality signal sent out from the fluorine gas generator judging unit, and the fluorine gas generator abnormality signal receiving unit sends a signal to the fluorine gas generator gate valve to be closed between the gas supplying system and each fluorine gas generator when the fluorine gas generator abnormality signal receiving unit receives an abnormality signal sent from the fluorine gas generator judging unit.

11. The semiconductor manufacturing plant according to claim 7, further comprising:

a plurality of fluorine gas generators; and a plurality of semiconductor manufacturing apparatus, wherein a semiconductor manufacturing apparatus gate valve is provided between each semiconductor manufacturing apparatus and the gas supplying system, each of the semiconductor manufacturing apparatus comprises a semiconductor manufacturing apparatus judging unit that generates an abnormality signal on the basis of a signal from a sensor provided in each of the semiconductor manufacturing apparatus when the sensor detects an internal abnormality, the gas supplying system comprises a semiconductor manufacturing apparatus abnormality signal receiving unit that receives the abnormality signal sent out from the semiconductor manufacturing apparatus judging unit, and the semiconductor manufacturing apparatus abnormality signal receiving unit sends a signal to the semiconductor manufacturing apparatus gate valve to be closed when the semiconductor manufacturing apparatus abnormality signal receiving unit receives an abnormality signal sent out from the semiconductor manufacturing apparatus judging unit.

12. The semiconductor manufacturing plant according to claim 7, wherein the gas supplying system further comprises:

a first path having a first storage tank gate valve in the middle of the path, through which fluorine gas can be supplied by its own pressure in the storage tank to the semiconductor manufacturing apparatus;

a second path having, in the middle of the path, a pressure controlling unit that controls the gas outlet pressure from the storage tank, and a second storage tank gate valve provided between the pressure controlling unit and the storage tank;

a path pressure detecting unit provided in a path between the storage tank and the semiconductor manufacturing apparatus or in the second path so as to be able to detect the pressure in the first or second path;

a path controlling unit that controls switching between the first and second paths in accordance with the pressure value detected by the path pressure detecting unit; and an operation controlling unit that controls the operation of the pressure controlling unit when the path is switched by the path controlling unit into the second path.

13. The semiconductor manufacturing plant according to claim 7, wherein each of the fluorine gas generator, the gas supplying system, and the semiconductor manufacturing apparatus is contained in a casing equipped with an exhaust mechanism, and each exhaust mechanism comprises a fluorine gas or hydrogen fluoride gas detector that detects fluorine gas or hydrogen fluoride gas.

* * * * *

UNITED STATES PATENT AND TRADEMARK OFFICE
CERTIFICATE OF CORRECTION

PATENT NO.         : 8,387,559 B2
APPLICATION NO.    : 12/278407
DATED              : March 5, 2013
INVENTOR(S)        : Hiraiwa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1226 days.

Signed and Sealed this
First Day of September, 2015

Michelle K. Lee
*Director of the United States Patent and Trademark Office*